United States Patent
Muellner et al.

(10) Patent No.: US 6,888,906 B2
(45) Date of Patent: May 3, 2005

(54) CLOCK AND DATA REGENERATOR WITH DEMULTIPLEXER FUNCTION

(75) Inventors: Ernst Muellner, Munich (DE); Claus-Joerg Weiske, Fuerstenfeldbruck (DE)

(73) Assignee: Siemens Aktiengesellschaft, Munich (DE)

(*) Notice: Subject to any disclaimer, the term of this patent is extended or adjusted under 35 U.S.C. 154(b) by 781 days.

(21) Appl. No.: 09/941,082

(22) Filed: Aug. 28, 2001

(65) Prior Publication Data

US 2002/0064241 A1 May 30, 2002

(30) Foreign Application Priority Data

Aug. 28, 2000 (DE) .......................................... 100 42 233

(51) Int. Cl.[7] .............................................. H03D 3/24
(52) U.S. Cl. ...................... 375/375; 375/376; 375/355; 327/156; 327/159; 327/147
(58) Field of Search ................................ 375/340, 355, 375/371, 373, 375, 376, 354; 327/156, 161, 152, 159, 160, 150, 147

(56) References Cited

U.S. PATENT DOCUMENTS

| | | | | |
|---|---|---|---|---|
| 5,317,283 A | * | 5/1994 | Korhonen | 331/1 A |
| 5,418,822 A | * | 5/1995 | Schlachter et al. | 375/354 |
| 6,064,707 A | * | 5/2000 | Woodman, Jr. | 375/373 |
| 6,236,696 B1 | * | 5/2001 | Aoki et al. | 375/376 |
| 6,262,611 B1 | * | 7/2001 | Takeuchi | 327/159 |
| 6,269,137 B1 | * | 7/2001 | Colella et al. | 375/355 |
| 6,373,911 B1 | * | 4/2002 | Tajima et al. | 375/375 |
| 6,765,975 B1 | * | 7/2004 | Dunning et al. | 375/371 |

FOREIGN PATENT DOCUMENTS

DE    197 17 586 C1    8/1998

OTHER PUBLICATIONS

IEEE Journal of Solid State Circuits, vol. 34, No. 9, Sep. 1999, pp. 1320–1324.

* cited by examiner

*Primary Examiner*—Phuong Phu
(74) *Attorney, Agent, or Firm*—Bell Boyd & Lloyd LLC

(57) ABSTRACT

Clock and data regenerator with demultiplexer function wherein the clock and phase generator operates with four sampling flip-flops whose output signals are compared with one another with the aid of two pairs of EXOR elements. The associated phase signals generated by the EXOR elements are added and compared with one another. The phase regulating voltage thus obtained controls an oscillator which generates the sampling clock signals.

4 Claims, 2 Drawing Sheets

CLOCK AND DATA REGENERATOR WITH DEMULTIPLEXER FUNCTION

BACKGROUND OF THE INVENTION

Clock and data regenerators for high data rates are often combined with a demultiplexer function which divides the data signal into at least two data signals having half the data rate, which are then fed to an EXOR element which follows as phase detector.

IEEE Journal of Solid State Circuits Volume 34, No. 9, September 1999, pages 1320–1324, describes such a phase detector which has a third sampling flip-flop which is clocked by a phase-shifted clock signal.

This principle is likewise used in the patent specification DE 19717586 C1, but two EXOR elements are used in order to generate a comparison voltage and thus to compensate propagation time changes due to temperature differences.

Owing to the sampling signals that are phase-shifted by 180° relative to one another, all the even-numbered bits of the data signal are accepted in a first sampling flip-flop and all the odd-numbered bits in a second sampling flip-flop. A third sampling flip-flop, referred to here as reference sampling flip-flop, is sampled with a clock signal delayed by 90°, that is to say in the temporal center between the other clock signals, and thus supplies an output signal which, given optimal sampling, is uncorrelated with the output signals of the other sampling flip-flops. By contrast, if the clock phase deviates from the desired value, the output signal of this flip-flop is correlated with the output signal of one of the other sampling flip-flops, which leads to a corresponding output signal of the EXOR elements acting as correlators. After filtering, the signal is used for correcting the clock phase of a voltage-controlled oscillator.

It is a fundamental property of this arrangement that, owing to the sampling at half the data rate, only every second state of change in the input signal is evaluated for the correlation function; namely, by way of example, the transition from odd-numbered to even-numbered bits. If the input signal is configured in such a way that, at the instant of sampling by the third sampling flip-flop, no state change takes place in pairs over a relatively long time, such as, for example, in the case of a data signal "00110011", then no differential signal occurs between the outputs of the EXOR elements. This state is maintained until either the data signal changes or the phase of the third clock signal has shifted to such an extent that state changes occur again. The output data signals are then interchanged, however, and bit errors occur until resynchronization.

It is an object of the present invention, therefore, to specify a clock and data regenerator with demultiplexer which generates a phase regulating voltage for every change of a data signal.

SUMMARY OF THE INVENTION

A particular advantage of the present invention resides in the evaluation of all the state changes of the data signal. Therefore, a phase regulating voltage is generated as soon as changes occur in the data signal.

In an embodiment of the present invention, a clock and data regenerator is provided which includes: a first sampling flip-flop having a data input for receiving a data signal, having a clock input for receiving a first clock signal having a clock period corresponding to a duration of two bits of the data signal, and having an output; a second sampling flip-flop having a data input for receiving the data signal, having a clock input for receiving a second clock signal which is phase-shifted by 180° with respect to the first clock signal, and having an output; a third sampling flip-flop serving as a reference sampling flip-flop, the third sampling flip-flop having a data input for receiving the data signal, having a clock input for receiving a third clock signal which is phase-shifted by 90° with respect to at least one of the first and second clock signals, and having an output; a fourth sampling flip-flop serving as a reference sampling flip-flop, the fourth sampling flip-flop having a data input for receiving the data signal, having a clock input for receiving a fourth clock signal which is phase-shifted by 180° relative to the third clock signal, and having an output; a first EXOR element having a first input connected to the output of the first sampling flip-flop, having a second input connected to the output of the third sampling flip-flop, and having an output; a second EXOR element having a first input connected to the output of the second sampling flip-flop, having a second input connected to the output of the third sampling flip-flop, and having an output; a third EXOR element having a first input connected to the output of the second sampling flip-flop, having a second input connected to the output of the fourth sampling flip-flop, and having an output; a fourth EXOR element having a first input connected to the first sampling flip-flop, having a second input connected to the output of the fourth sampling flip-flop, and having an output; an addition and comparison circuit for combining the output of the first EXOR element with the output of the third EXOR element to produce a first result, for combining the output of the second EXOR element with the output of the fourth EXOR element to produce a second result, and for comparing the first and second results to produce a phase regulating signal which is then filtered; and an oscillator, wherein the filtered phase regulating signal controls a frequency of the oscillator.

In an embodiment, the addition and comparison circuit includes first and second adders and a comparison circuit, the outputs of the first and third EXOR elements being combined in the first adder to produce the first result, the outputs of the second and fourth EXOR elements being combined in the second adder to produce the second result, and the first and second results being compared in the comparison circuit.

In an embodiment, a subtractor designed as a low-pass filter is provided as the comparison circuit.

In yet another embodiment of the present invention, the clock and data regenerator includes two further sampling stages and two further reference sampling stages having clock inputs for receiving clock signals each shifted by 45°, a duration of the clock signals corresponding to a duration of four bits of the data signal, and further including four pairs of EXOR elements and a further addition and comparison circuit which adds corresponding phase signals of the four pairs of EXOR elements and compares the added signals with one another.

Numerous circuit variations can be used, of course. Thus, it is possible, for example, to subtract the output signals of each EXOR element pair from one another and then to compare the results. It is also possible to perform boolean conversions including the inversion of input signals and the use of EXNOR instead of EXOR gates, etc. It is also possible to vary the circuit for specific types of code (CMI code) and to suppress phase regulating signals for a specific change in the data signal or bit combinations.

Through the use of further sampling flip-flops and reference sampling flip-flops, it is possible to extend the circuit for demultiplexing into four or more parallel data streams.

Additional features and advantages of the present invention are described in, and will be apparent from, the following detailed description of the invention and the figures.

DETAILED DESCRIPTION OF THE INVENTION

Figure 1:
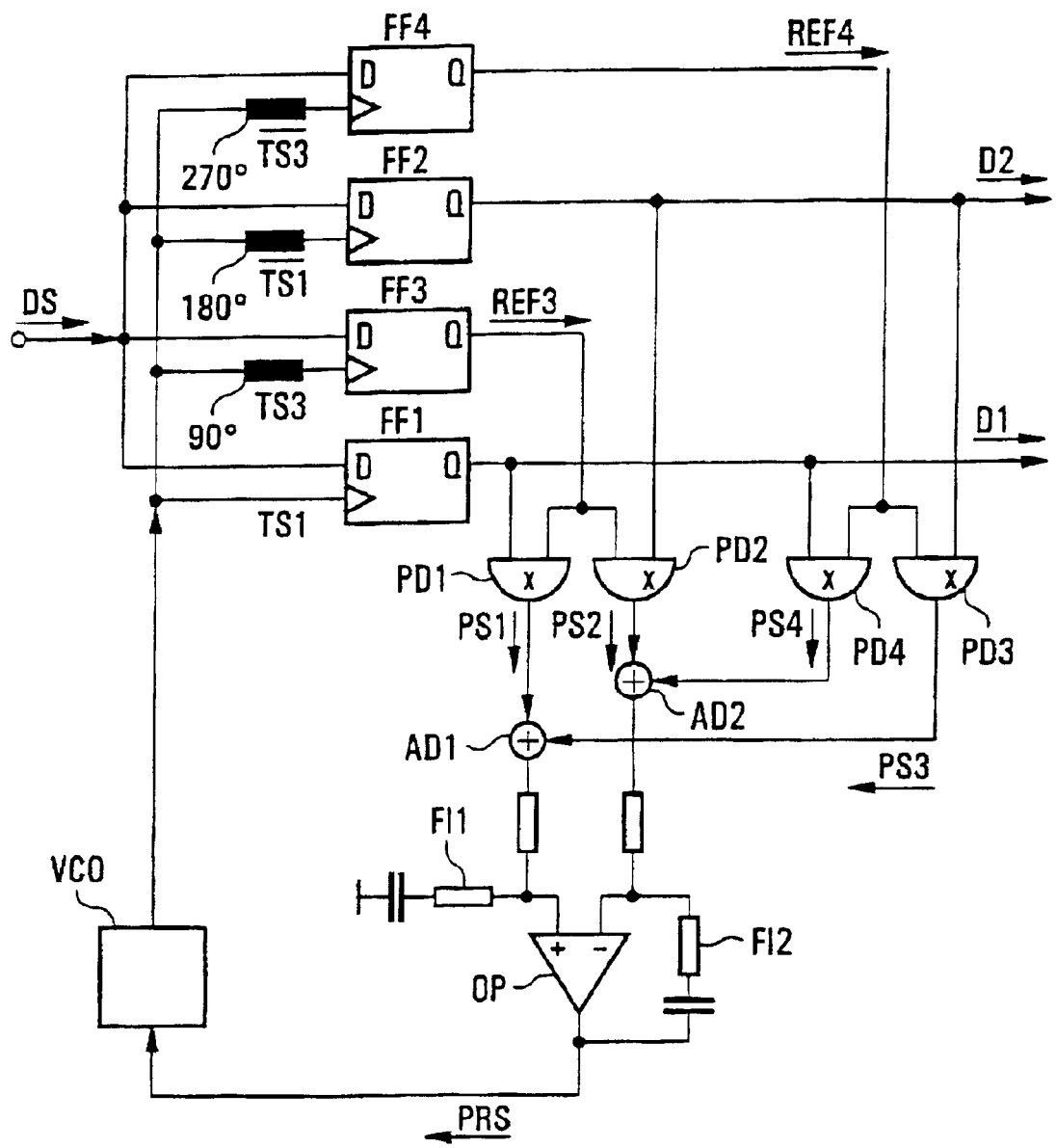
FIG. 1 shows an exemplary embodiment of the clock and data generator of the present invention.
Figure 2:
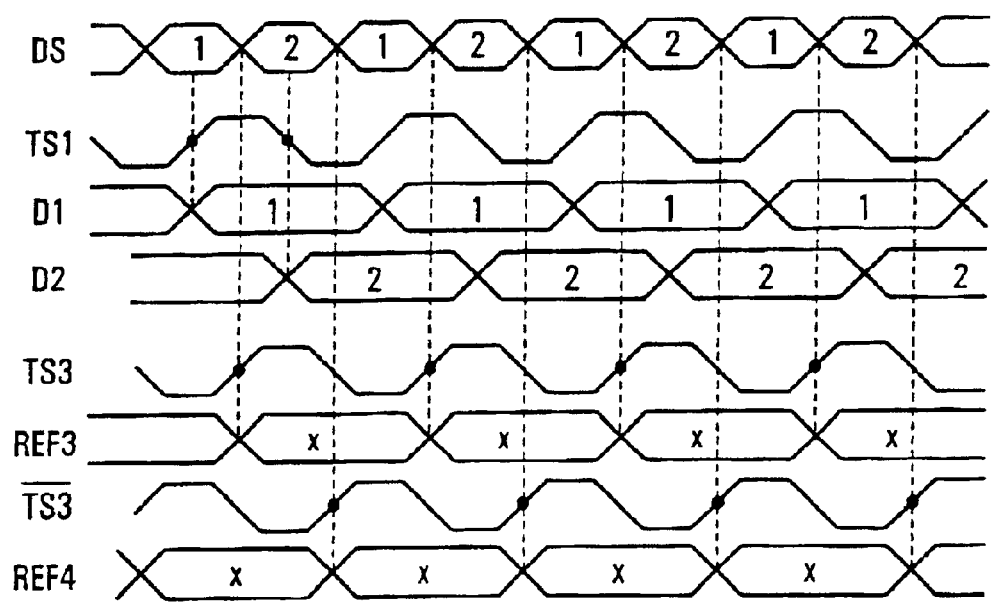
FIG. 2 shows a timing diagram associated with the clock and data generator of the present invention.

FIG. 1 illustrates a clock and data generator according to the present invention. It contains four sampling flip-flops FF1 to FF4. This data signal is sampled by four clock signals TS1, $\overline{TS1}$, TS3 and $\overline{TS3}$ which are phase-shifted relative to one another. One period of these clock signals encompasses two bits of the data signal. The effective edges of the clock signals TS1 and $\overline{TS1}$ are phase-shifted by 180°. The clock signal TS3 is shifted by 90° relative to the clock signal TS1. Equally, the clock signal $\overline{TS3}$ is shifted by 180° relative to the clock signal TS3 and the clock signal $\overline{TS3}$ is shifted by 90° relative to the clock signal $\overline{TS1}$.

In the locked state of the clock regenerator, the bits of the data signal DS are sampled by the clock signals TS1 and $\overline{TS1}$ in the center, accepted into the sampling flip-flops FF1 and FF2 and broken down into two data signals D1 and D2 which, for their part, can contain two or more data signals which are interleaved with one another according to the time division multiplexing method. In addition, the data signal is sampled with the clock signals TS3 and $\overline{TS3}$ whose effective edges coincide with the edges of the data signal. The sampled bits are accepted into the reference sampling flip-flops FF3 and FF4.

Four phase signals PS1 and PS2 and also PS3 and PS4 are generated in a manner known, per se, by EXOR elements, in this case EXNOR gates PD1, PD2, PD3 and PD4. Corresponding phase signals PS1 and PS3 are added in a first adder AD1 and the phase signals PS2 and PS4 are added in a second adder AD2 and are then compared with one another in a comparison circuit, an operational amplifier OP. The operational amplifier is simultaneously designed as a low-pass filter so that a filtered phase regulating voltage PRS is output by the comparison circuit and controls an oscillator VCO, which outputs the sampling clock signal TS1. In contrast to what is illustrated symbolically, the shifting of the clock signals relative to one another is generally not achieved by delay elements, but by inverting clock signals.

Although the present invention has been described with reference to specific embodiments, those of skill in the art will recognize that changes may be made thereto without departing from the spirit and scope of the invention as set forth in the hereafter appended claims.

The invention is claimed as follows:

1. A clock and data regenerator:
   a first sampling flip-flop having a data input for receiving a data signal, having a clock input for receiving a first clock signal having a clock period corresponding to a duration of two bits of the data signal, and having an output;
   a second sampling flip-flop having a data input for receiving the data signal, having a clock input for receiving a second clock signal which is phase-shifted by 180° with respect to the first clock signal, and having an output;
   a third sampling flip-flop serving as a reference sampling flip-flop, the third sampling flip-flop having a data input for receiving the data signal, having a clock input for receiving a third clock signal which is phase-shifted by 90° with respect to at least one of the first and second clock signals, and having an output;
   a fourth sampling flip-flop serving as a reference sampling flip-flop, the fourth sampling flip-flop having a data input for receiving the data signal, having a clock input for receiving a fourth clock signal which is phase-shifted by 180° relative to the third clock signal, and having an output;
   a first EXOR element having a first input connected to the output of the first sampling flip-flop, having a second input connected to the output of the third sampling flip-flop, and having an output;
   a second EXOR element having a first input connected to the output of the second sampling flip-flop, having a second input connected to the output of the third sampling flip-flop, and having an output;
   a third EXOR element having a first input connected to the output of the second sampling flip-flop, having a second input connected to the output of the fourth sampling flip-flop, and having an output;
   a fourth EXOR element having a first input connected to the first sampling flip-flop, having a second input connected to the output of the fourth sampling flip-flop, and having an output;
   an addition and comparison circuit for combining the output of the first EXOR element with the output of the third EXOR element to produce a first result, for combining the output of the second EXOR element with the output of the fourth EXOR element to produce a second result, and for comparing the first and second results to produce a phase regulating signal which is then filtered; and
   an oscillator, wherein the filtered phase regulating signal controls a frequency of the oscillator.

2. A clock and data regenerator as claimed in claim 1, wherein the addition and comparison circuit includes first and second adders and a comparison circuit, the outputs of the first and third EXOR elements being combined in the first adder to produce the first result, the outputs of the second and fourth EXOR elements being combined in the second adder to produce the second result, and the first and second results being compared in the comparison circuit.

3. A clock and data regenerator as claimed in claim 2, wherein a subtractor designed as a low-pass filter is provided as the comparison circuit.

4. A clock and data regenerator as claimed in claim 1, further comprising two further sampling stages and two further reference sampling stages having clock inputs for receiving clock signals each shifted by 45°, a duration of the clock signals corresponding to a duration of four bits of the data signal, and further comprising four pairs of EXOR elements and a further addition and comparison circuit which adds corresponding phase signals of the four pairs of EXOR elements and compares the added signals with one another.

* * * * *